US007663065B2

(12) United States Patent
Chen et al.

(10) Patent No.: US 7,663,065 B2
(45) Date of Patent: Feb. 16, 2010

(54) SHIELD BOX

(75) Inventors: Haijun Chen, Makinohara (JP); Mitsuhiro Matsumoto, Makinohara (JP)

(73) Assignee: Yazaki Corporation, Tokyo (JP)

( * ) Notice: Subject to any disclaimer, the term of this patent is extended or adjusted under 35 U.S.C. 154(b) by 18 days.

(21) Appl. No.: 12/176,030

(22) Filed: Jul. 18, 2008

(65) Prior Publication Data

US 2009/0025974 A1 Jan. 29, 2009

(30) Foreign Application Priority Data

Jul. 24, 2007 (JP) .......................... P2007-191965

(51) Int. Cl.
*H01R 13/648* (2006.01)
*H05K 9/00* (2006.01)

(52) U.S. Cl. .......................... 174/359; 174/51; 174/377

(58) Field of Classification Search .................. 174/51, 174/359, 376, 377; 361/816, 818, 800; 439/607.23
See application file for complete search history.

(56) References Cited

U.S. PATENT DOCUMENTS

| | | | | |
|---|---|---|---|---|
| 5,763,830 | A * | 6/1998 | Hsueh | 174/60 |
| 5,942,725 | A * | 8/1999 | Daoud | 174/51 |
| 6,043,880 | A * | 3/2000 | Andrews et al. | 356/311 |
| 6,114,630 | A * | 9/2000 | Gretz | 174/660 |
| 6,320,125 | B1 * | 11/2001 | McKay et al. | 174/51 |
| 6,977,822 | B2 * | 12/2005 | Otani et al. | 361/800 |
| 7,005,575 | B2 * | 2/2006 | Hedstrom | 174/50 |
| 7,061,775 | B2 * | 6/2006 | Beihoff et al. | 361/818 |
| 7,067,734 | B2 * | 6/2006 | Abe et al. | 174/359 |
| 7,170,002 | B2 * | 1/2007 | Thompson | 174/51 |
| 7,595,445 | B2 * | 9/2009 | Legendre et al. | 174/33 |

FOREIGN PATENT DOCUMENTS

| | | |
|---|---|---|
| JP | 2002-216907 | 8/2002 |

* cited by examiner

*Primary Examiner*—Hung V Ngo
(74) *Attorney, Agent, or Firm*—Finnegan, Henderson, Farabow, Garrett & Dunner, L.L.P.

(57) ABSTRACT

A shield box is composed of metal-made upper box and lower box, which are combined with each other. The shield box houses therein a plurality of shield connectors interconnecting shield wires, and thereby electromagnetically shields entirety of the shield connectors and the shield wires. On an upper surface of a lower surface plate of the lower box, clamp fittings capable of restraining the respective shield connectors in axial, axial rotation, left-and-right and up-and-down directions thereof are provided. On opposite surfaces of the upper and lower boxes, press fittings are provided to sandwich shield terminal portions from upper and lower sides and conduct the shield terminal portions to the upper and lower boxes when the upper and lower boxes are matched with each other. The shield terminal portions, which are electrically connected to shield conductors of respective shield wires and are exposed to both ends of the respective shield connectors, are grounded.

6 Claims, 15 Drawing Sheets

SHIELD BOX

CROSS REFERENCE TO RELATED APPLICATION

This application claims benefit of priority under 35 USC 119 based on Japanese Patent Application P2007-191965 filed Jul. 24, 2007, the entire contents of which are incorporated by reference herein.

BACKGROUND OF THE INVENTION

1. Field of the Invention

The present invention relates to a shield box capable of surely fixing all shield connectors thereto, and capable of enhancing shielding reliability thereof.

2. Description of the Related Art

Japanese Patent Laid-Open Publication No. 2002-216907 discloses a structure of grounding shield terminals, which are conducted to shield conductors of a plurality of shield wires, to a ground member while arraying and fixing terminals of the respective wires.

In accordance with such a shield structure, the plurality of shield wires are arrayed in parallel to one another between two (first and second) conductive sandwiching members, and the plurality of shield wires are sandwiched by the first and second conductive sandwiching members. The shield wires are sandwiched by the conductive sandwiching members, whereby the respective shield wires are fixed. In addition, the sandwiching members contact the shield terminals, whereby the shield terminals are grounded to the ground member.

SUMMARY OF THE INVENTION

However, in the structure described in Japanese Patent Laid-Open Publication No. 2002-216907, what is done is only to sandwich the shield wires by the two sandwiching members. Hence, the shield wires are prone to move. Moreover, when the wires undesirably move, there is an apprehension that shield performance thereof may be decreased. In particular, when three or more of the shield wires are arrayed, if center portions of the sandwiching members sag and warp, then restraint on the center shield wire becomes prone to be weak, and the respective wires become prone to move. Hence, in this case, there is a problem that shielding property is decreased.

A similar problem occurs also in the case of arraying and housing a plurality of shield connectors, which interconnect the shield wires, in an inside of a shield box. Also in this case, it is necessary to ground shield terminals provided in the respective shield connectors. However, unless the shield box and the shield terminals are surely brought into contact with and conducted to each other, then there is a possibility that the shielding reliability may be impaired.

The present invention has been made in consideration for the above-described circumstances. It is an object of the present invention to provide a shield box that houses therein the plurality of shield connectors interconnecting the shield wires, wherein each of all the shield connectors can be surely fixed to the shield box concerned, whereby the shielding reliability can be achieved.

The present invention is a shield box that houses therein a plurality of shield connectors interconnecting shield wires, and electromagnetically shields entirety of the shield connectors and the shield wires, including: a metal-made upper box; a metal-made lower box combined with the metal-made upper box; clamp mechanisms provided on an upper surface of a lower surface plate of the lower box; and press fittings provided on opposite surfaces of the upper box and the lower box, wherein, in a case of individually mounting the respective shield connectors, the clamp mechanisms restrain the respective shield connectors in axial, axial rotation, left-and-right and up-and-down directions thereof, and when the upper box and the lower box are combined with each other, the press fittings sandwich shield terminal portions of both ends of the shield connectors from upper and lower sides, and bring the shield terminal portions into electric contact with the upper box and the lower box.

In the shield box of the present invention, each of the clamp mechanisms may include first to third sandwiching pieces provided so as to correspond to first to third sandwiched portions arranged in a longitudinal direction of the shield connector. In this case, the first to third sandwiching pieces sandwich the respective sandwiched portions from left and right sides when the respective sandwiched portions are inserted thereinto from the above, and thereby hold the shield connector while restraining the shield connector in the left-and-right direction. Moreover, the first sandwiching piece may include curved portions with a circular arc shape corresponding to a cylindrical shape of the first sandwiched portion, may have a width enough to allow engagement thereof with the first sandwiched portion of which width is defined by protrusions provided fore and aft of the first sandwiched portion, and may thereby regulate movement of the shield connector in the axial direction. Furthermore, the second sandwiching piece may sandwiche the second sandwiched portion formed into a rectangular shape in cross section from the left and right sides, and may thereby regulate rotation of the shield connector about an axis thereof. Still further, the third sandwiching piece may have curved portions with a circular arc shape corresponding to a cylindrical shape of the third sandwiched portion, and sandwiches the third sandwiched portion from the left and right sides while ensuring a play in the axial direction. Furthermore, in a case where the respective first to third sandwiched portions are individually inserted into the first to third sandwiching pieces, the first sandwiching piece and the third sandwiching piece may regulate the movement of the shield connector in the axial direction, the left-and-right direction and the up-and-down direction, and the second sandwiching piece may regulate the movement of the shield connector about the axis.

In the shield box of the present invention, each of the press fittings may be a band plate having V-type groove portions formed by bending the band plate to a V shape. In this case, the V-type groove portions are provided in an elastically supported state at positions floated from the upper surface plate of the upper box and the lower surface plate of the lower box, and the shield terminal portions are sandwiched by the V-type groove portions of one of the press fittings and by the V-type groove portions of the other press fitting, each V-type groove portion making a pair with the V-type groove portion of the one of the press fittings.

In the above-described shield box, on a V-type wall that forms at least one of the V-type groove portions which make each pair, cut and raised spring pieces which urge the shield terminal portion toward the other V-type groove portion may be provided.

The shield box of the present invention may further include: outlets for the shield wires, which are provided in regions where fore-and-aft end surface plates of the upper box and the lower box are allowed to overlap each other; engagement holes and engagement protrusions, which are provided in at least left-and-right center regions of the fore-and-aft end surface plates, are engaged with each other, and thereby combine the upper box and the lower box with each other; and attachment brackets which are provided on left-and-right side edges of the upper box and the lower box, are protruded outward therefrom, and vertically overlap each other when the upper box and the lower box are matched with each other. In this case, it is preferable that the clamp mechanisms be arrayed in the left-and-right direction so as to be capable of arraying the plurality of shield connectors in parallel to one another.

In the above-described shield box, at least one of the attachment brackets of the upper box may include a reinforcing bead extended in a bending direction of the attachment bracket on a surface of a region including a bent portion for forming the attachment bracket, and may be formed in such a manner that a protruding piece extended integrally on a lower end of a side plate of the upper box is bent outward perpendicularly.

In accordance with the shield box of the present invention, the clamp mechanisms which restrain the respective shield connectors in the axial, axial rotation, left-and-right and up-and-down directions are provided. Accordingly, the respective shield connectors can be surely fixed. In addition, the upper and lower boxes are matched with each other in the above-described state, whereby the shield terminal portions of both ends of the shield connectors are sandwiched by the press fittings from the upper and lower sides. Accordingly, contact between the press fittings and the shield terminal portions can be stabilized, and shielding reliability can be enhanced.

Moreover, the cylindrical sandwiched portions of each shield connector are sandwiched by the respective curved portions of the first sandwiching piece and the third sandwiching piece. Accordingly, in this state, the first sandwiching piece and the third sandwiching piece can regulate the movement of the shield connector in the axial direction, the left-and-right direction and the up-and-down direction. Moreover, the movement of the shield connector can be regulated at positions apart from each other by the first sandwiching piece and the third sandwiching piece, and accordingly, runout of each shield connector in the up-and-down direction and the left-and-right direction can also be prevented. Furthermore, the sandwiched portion of the shield connector, which has a rectangular shape in cross section, is sandwiched from the left and right sides by the second sandwiching piece, accordingly, rotation of the shield connector about an axis can also be regulated, and the contact between the press fittings and the shield terminal portions can be stabilized.

Furthermore, since the shield terminal portions are sandwiched by the V-type groove portions of the respective press fittings provided on the upper and lower boxes, the contact between the shield terminal portions and the press fittings can be stabilized. Moreover, the V-type groove portions are formed by performing bending processes for the band plates, and in addition, are elastically supported at the positions floated from the upper surface plate of the upper box and the lower surface plate of the lower box. Accordingly, the press fittings can be brought into elastic contact with the shield terminal portions, and more resistance to vibrations and the like is also brought up.

Moreover, since the cut and raised spring pieces are further provided on the V-type wall, the press fittings can be brought into contact with the shield terminal portions more gently, and the contact and conduction therebetween can be stabilized.

Moreover, the engagement holes and the engagement protrusions are provided in the left-and-right center regions of the end surface plates of the upper and lower boxes. Accordingly, also when the upper and lower boxes are fixed by the attachment brackets provided on the left and right ends thereof, the center portion of the upper box can be prevented from floating up, and the press fittings can be brought into contact with any of the shield terminal portions of the shield connectors in a good state, and the shielding performance can be stabilized.

Furthermore, even when the attachment bracket of the upper box is composed by bending the side plate thereof, the bead is provided on the plate surface of such a bent portion, whereby flexural rigidity of the attachment bracket concerned can be enhanced, and the shielding performance in a state where the shield connectors are fixed can be stabilized.

DESCRIPTION OF THE PREFERRED EMBODIMENT

Figure 1:
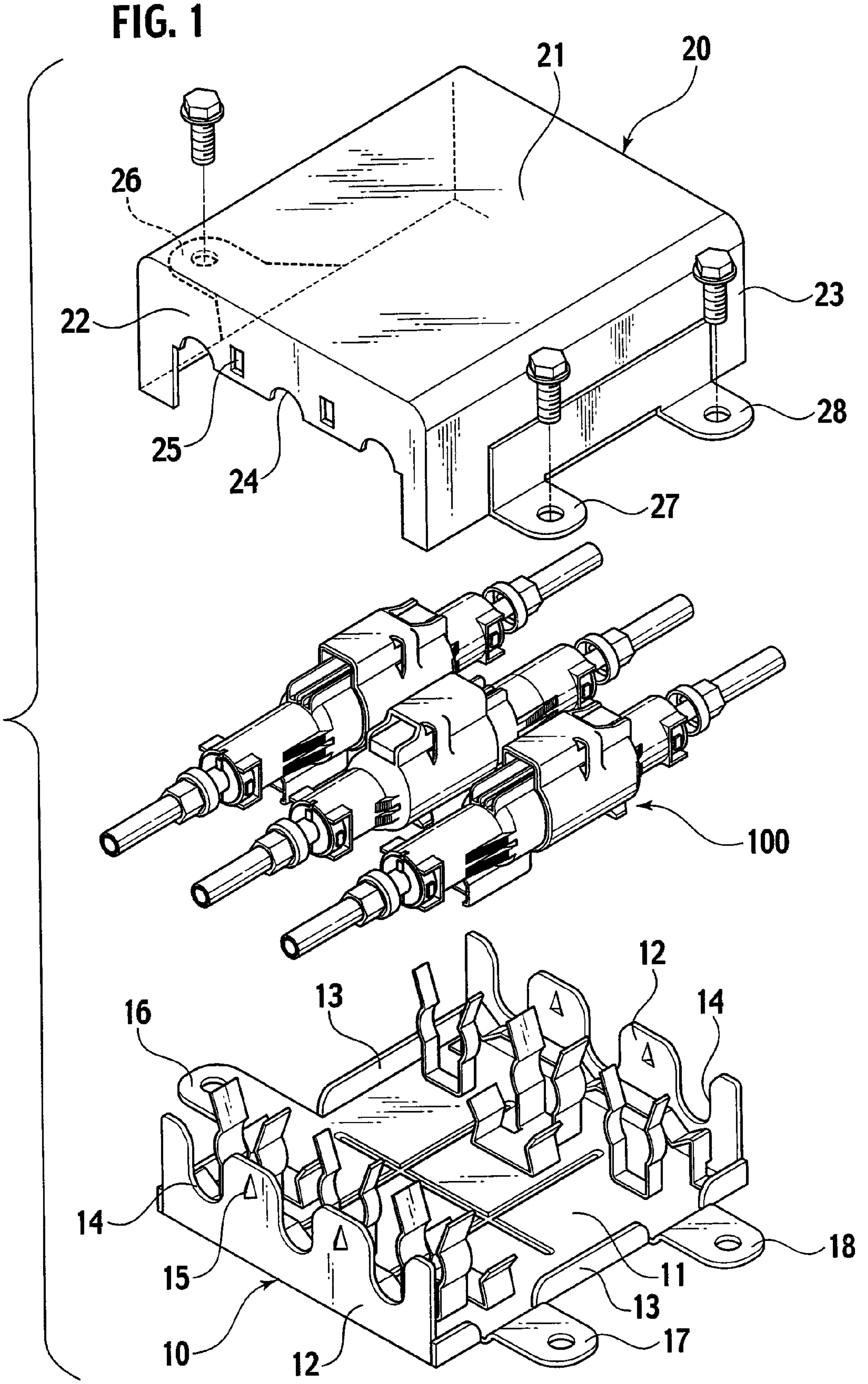
FIG. 1 is an exploded perspective view showing a relationship between a shield box according to an embodiment of the present invention and shield connectors.

A description will be made blow of an embodiment of the present invention while referring to the drawings.

Figure 2:
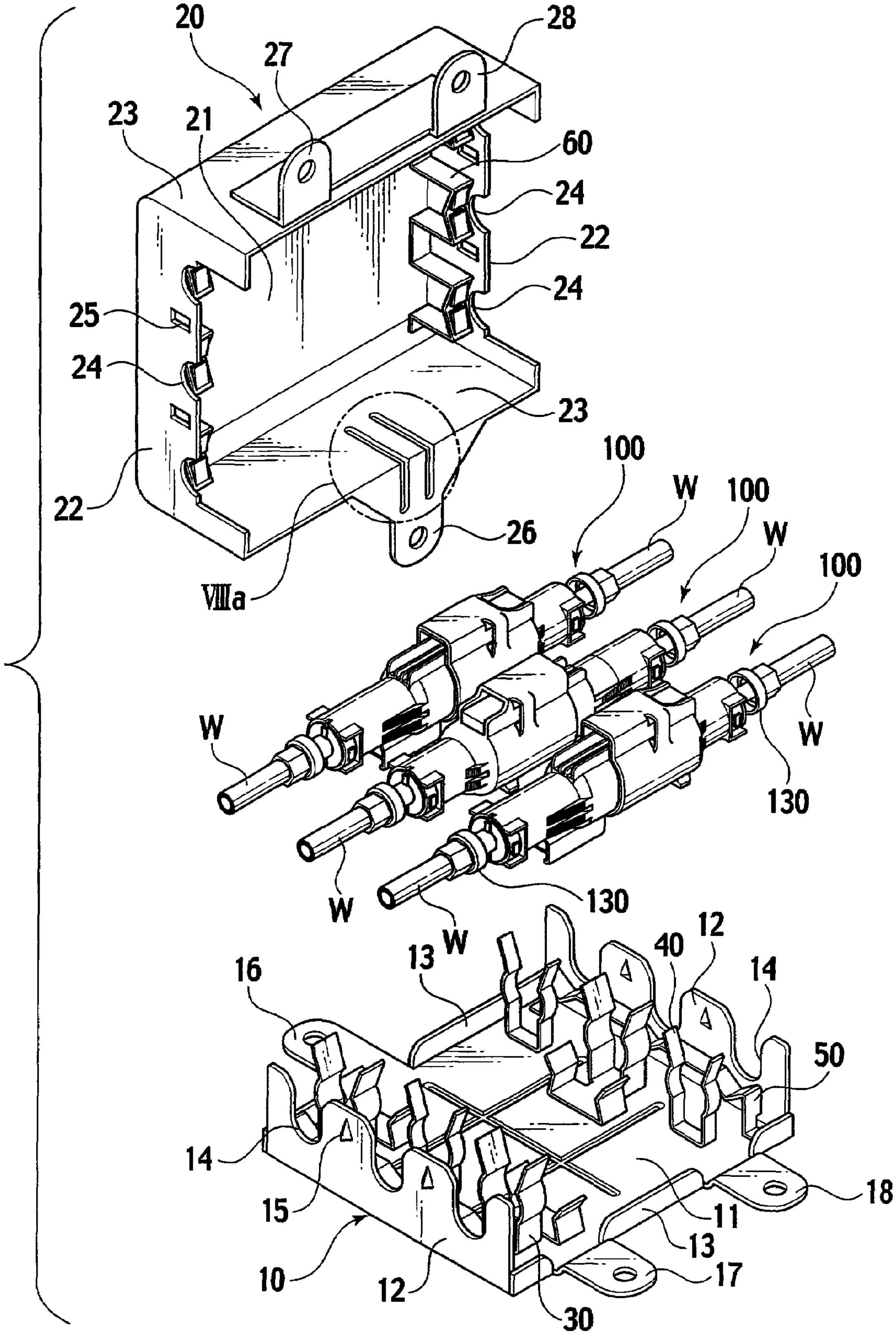
FIG. 2 is an exploded perspective view showing a relationship between the shield box and the shield connectors, viewed from another angle.
Figure 3:
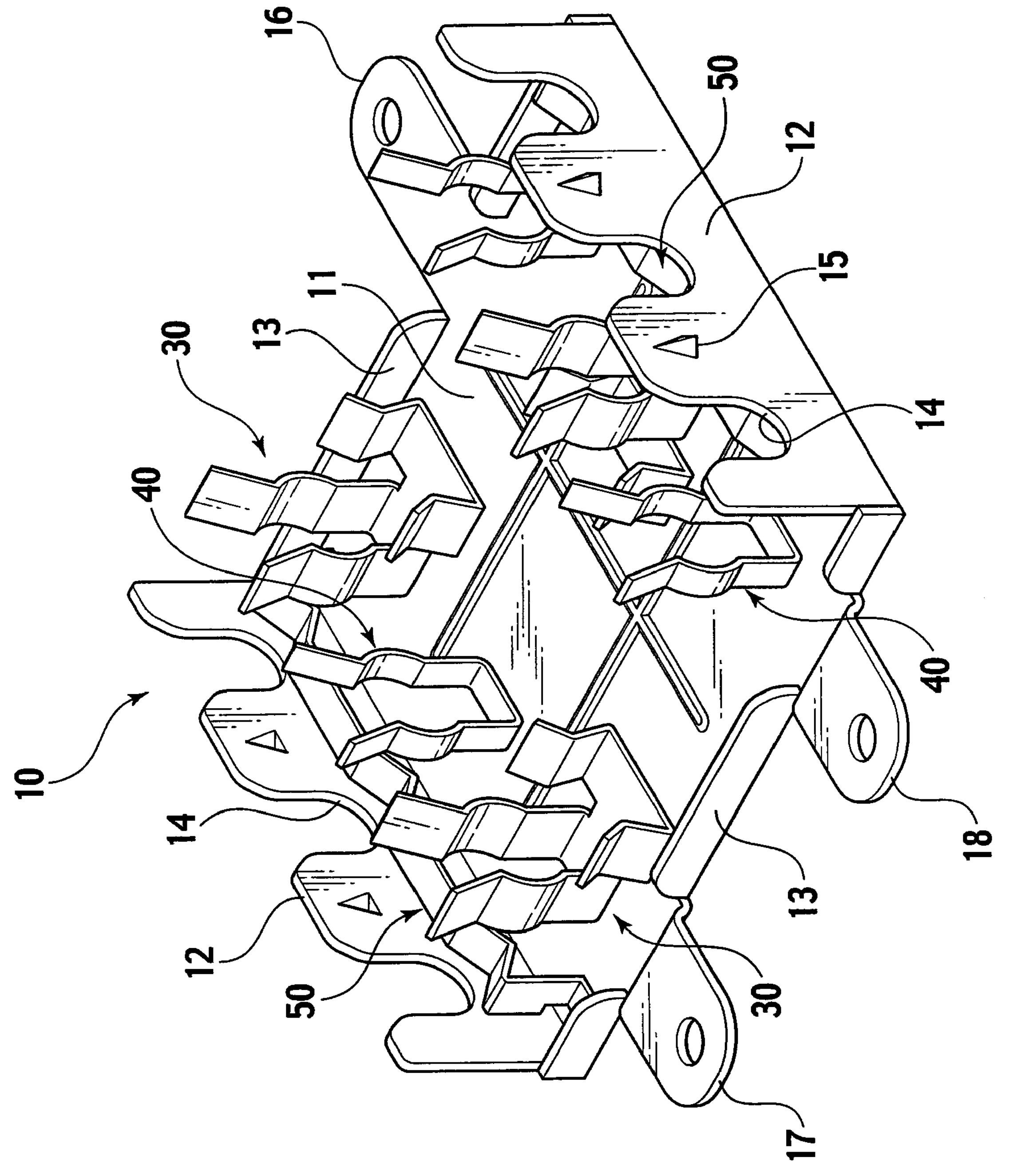
FIG. 3 is a perspective view showing a configuration of a lower box of the shield box.
Figure 4A:
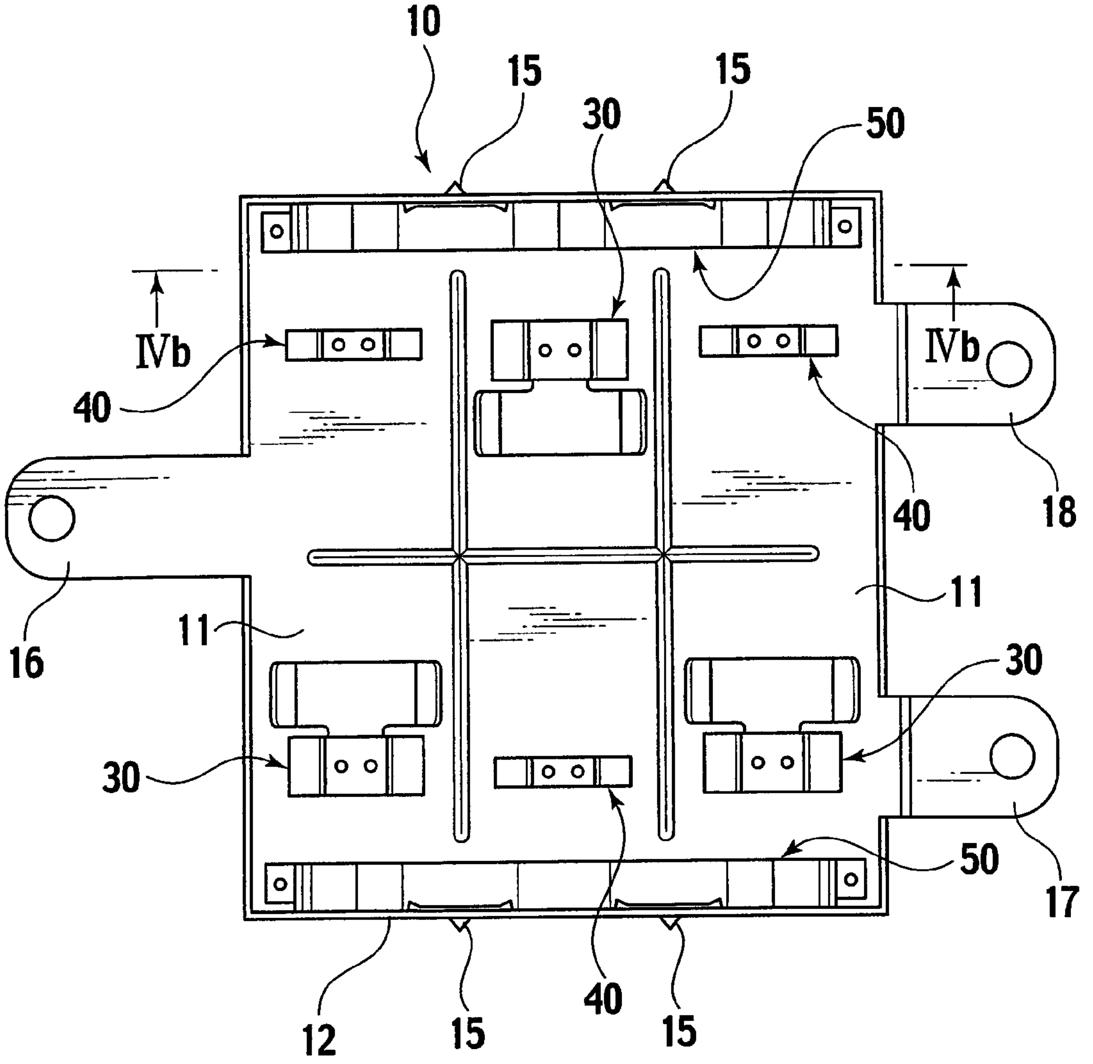
FIG. 4A is a plan view showing the configuration of the lower box.
Figure 4B:
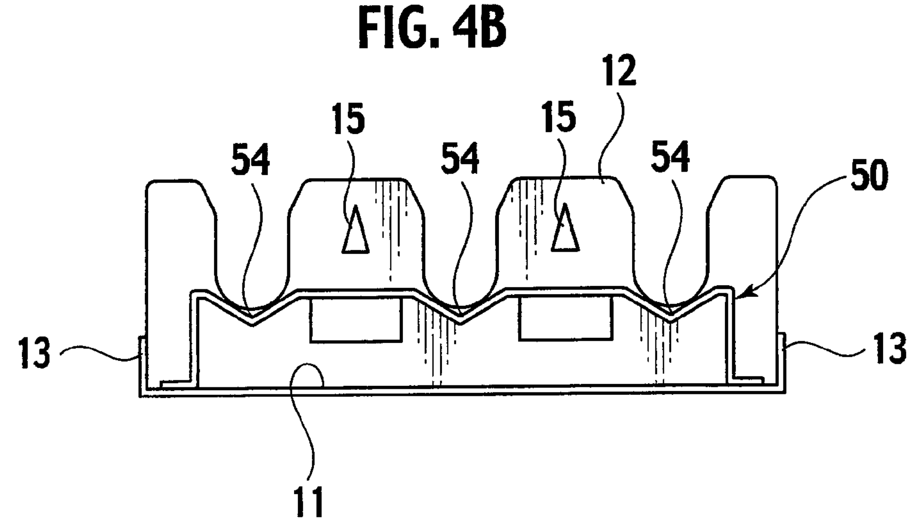
FIG. 4B is an arrow cross-sectional view taken along a line IVb-IVb of FIG. 4A.
Figure 12:
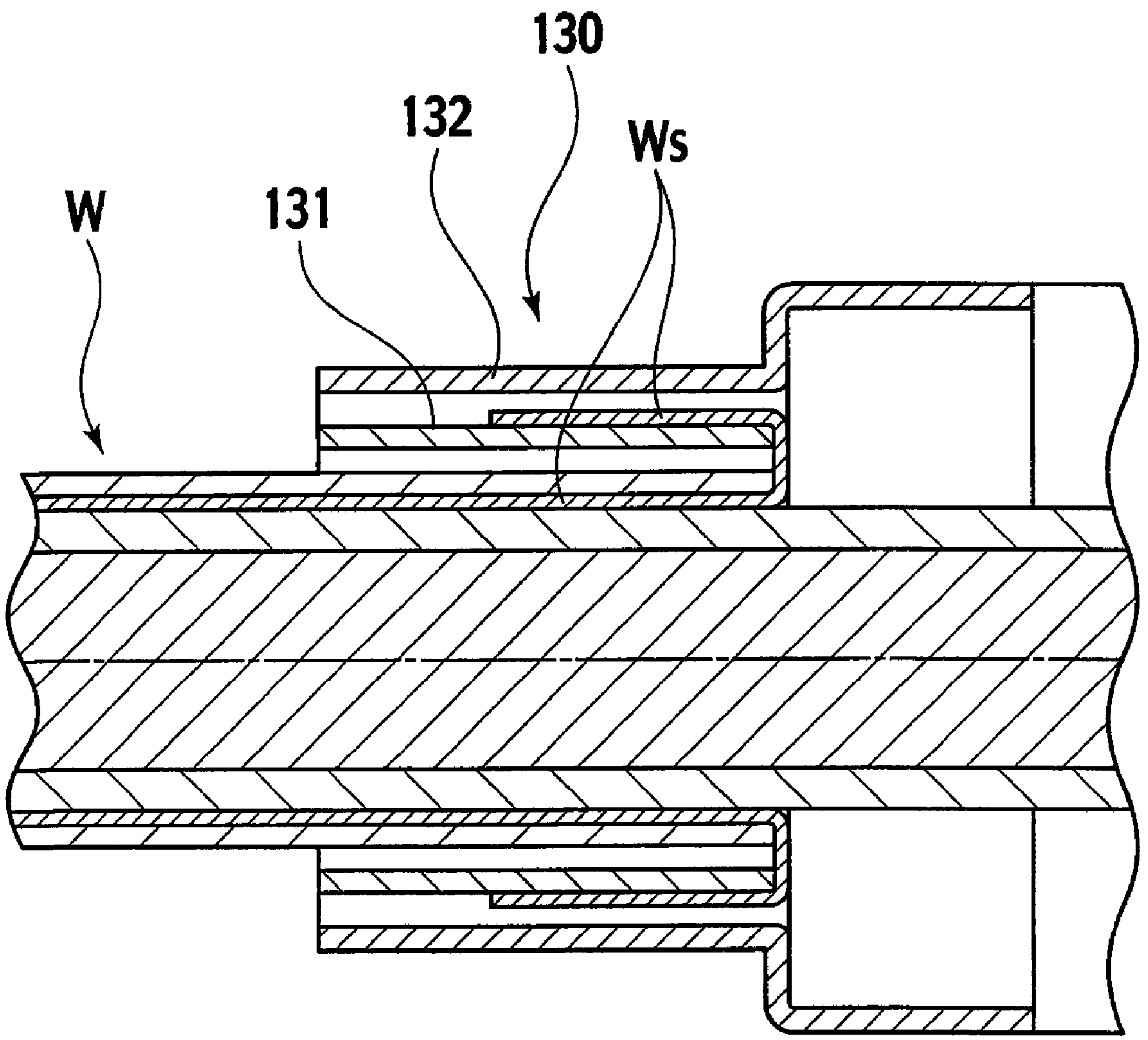
FIG. 12 is a longitudinal cross-sectional view of a shield terminal portion on each of both ends of the shield connector.
Figure 13:
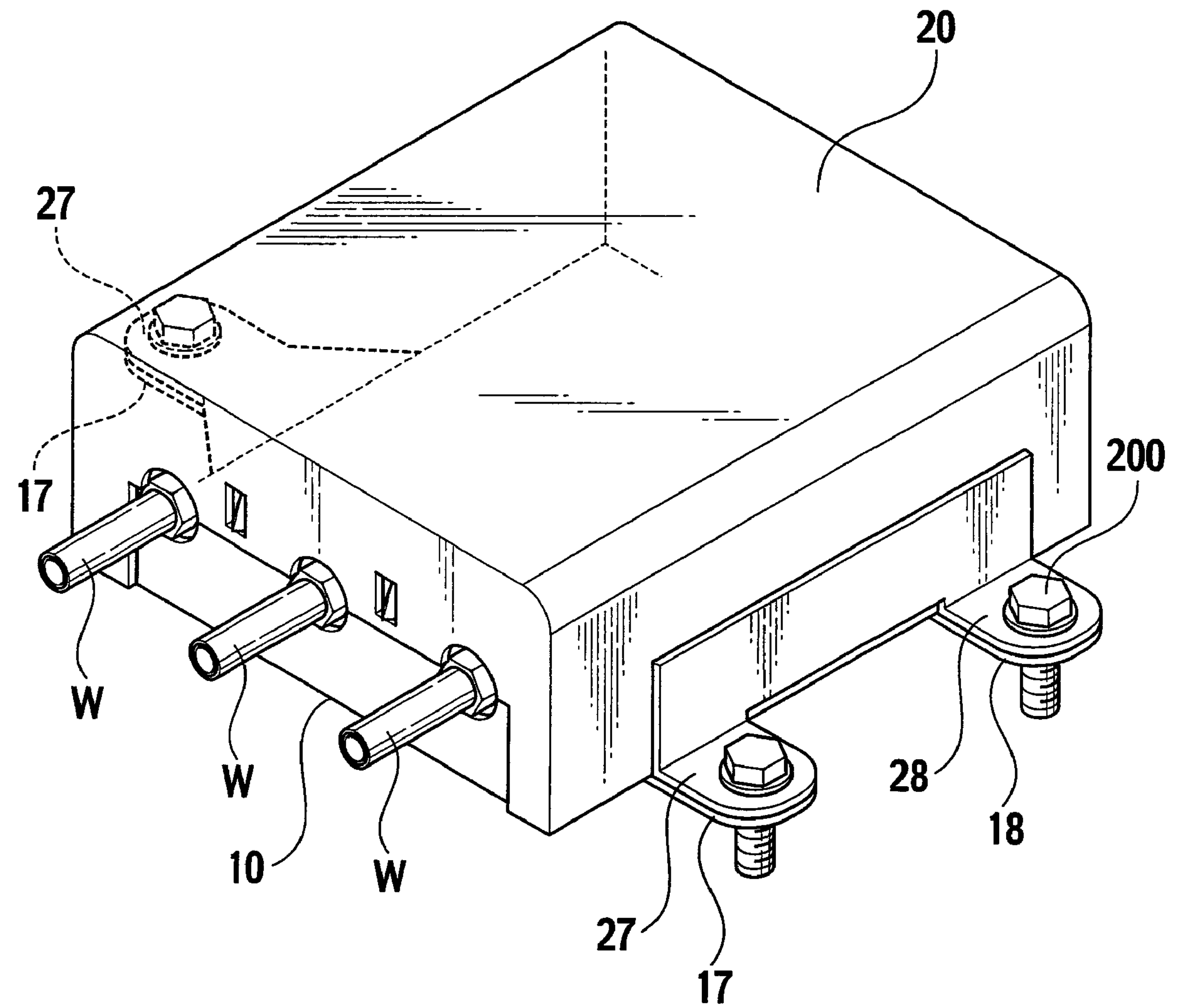
FIG. 13 is a perspective view showing an exterior appearance of the shield box of this embodiment when the shield connectors are housed therein.

As shown in FIG. 1 and FIG. 2, a shield box is composed of an upper box 20 and a lower box 10, which are made of metal and are combined with each other. The shield box houses therein three shield connectors 100, each of which interconnects shield wires W, and electromagnetically shields the entirety of the shield connectors 100 and the shield wires W. Moreover, as shown in FIG. 12, the shield box is electrically connected to shield conductors (braids) Ws of the respective shield wires W, and grounds shield terminal portions 130 exposed to both ends of the respective shield connectors 100.

As shown in FIGS. 3 to 5C, the lower box 10 includes: a lower surface plate 11; fore-and-aft end surface plates 12; left-and-right side surface ribs 13; and attachment brackets 16, 17 and 18 protruded outward on left-and-right side edges of the lower surface plate 11.

Meanwhile, as shown in FIGS. 6A to 7B, the upper box 20 includes: an upper surface plate 21; fore-and-aft end surface plates 22; left-and-right side surface plates 23; and attachment brackets 26, 27 and 28 protruded outward on lower ends of the left-and-right side surface plates 23.

Figure 14:
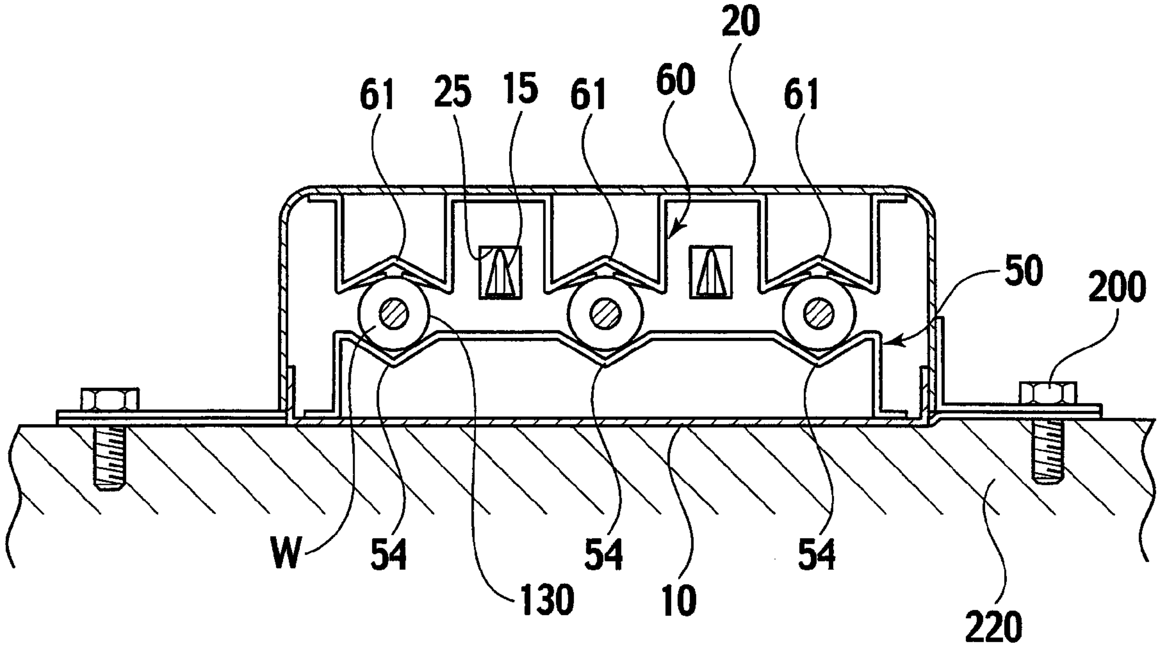
FIG. 14 is a cross-sectional view showing an inner structure of the shield box of this embodiment when the shield connectors are housed therein.

These attachment brackets 26, 27, 28, 16, 17 and 18 of the upper and lower boxes 20 and 10 vertically overlap each other when the upper and lower boxes 20 and 10 are matched with each other. As shown in FIG. 14, these brackets are fixed to a vehicle body 220 (attachment subject member) by screws 200 in such an overlapping state.

Figure 8A:
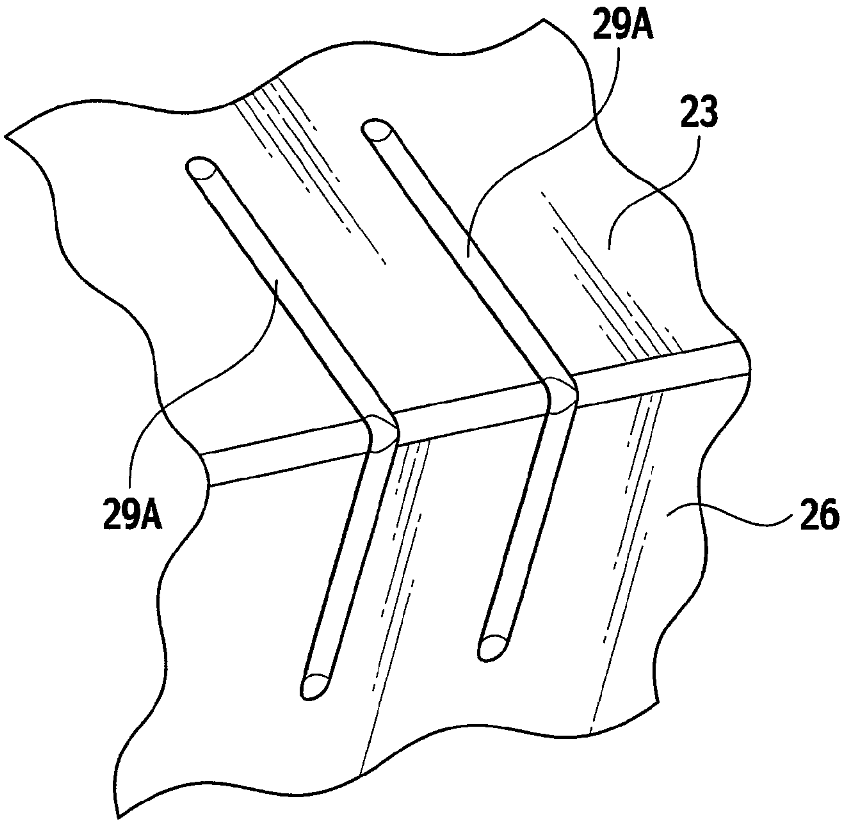
FIG. 8A is an enlarged view of a portion VIIIa of FIG. 2.
Figure 8B:
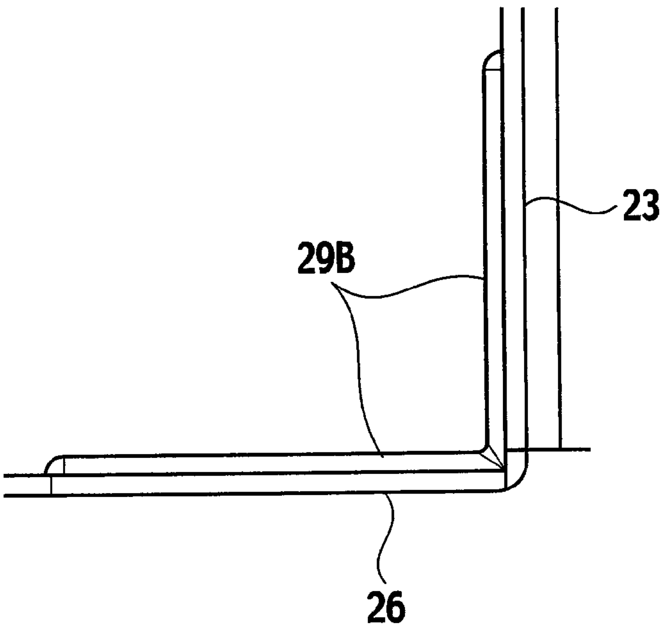
FIG. 8B is a side view of the portion.

The bracket 26 as at least one of the attachment brackets 26, 27 and 28 of the upper box 20 is formed in such a manner that a protruding piece extended integrally on the lower end of the side plate 23 of the upper box 20 is bent outward substantially perpendicularly. On front and back surfaces in a region including such a bent portion for forming the attachment bracket 26, as shown in FIGS. 8A and 8B, reinforcing beads 29A and 29B extended in a bending direction are provided.

Moreover, as shown in FIGS. 3 to 7B, the fore-and-aft end surface plates 22 and left-and-right side surface plates 23 of the upper box 20 cover the fore-and-aft end surface plates 12 and left-and-right side surface ribs 13 of the lower box 10. In overlap portions of the fore-and-aft end surface plates 22 and 12 of the upper and lower boxes 20 and 10, U-shaped wire outlets 24 and 14 for drawing outward the shield wires W interconnected by the shield connectors 100 are provided. Moreover, in the fore-and-aft end surface plates 22 and 12 of the upper and lower boxes 20 and 10, rectangular engagement holes 25 and triangular engagement protrusions 15 are provided. The engagement protrusions 15 are protruded outward, and are engaged with the engagement holes 25 when the upper and lower boxes 20 and 10 are matched with each other. Accordingly, the engagement holes 25 and the engagement protrusions 15, which prevent the upper and lower boxes 20 and 10 from leaving each other, are arranged among the wire outlets 24 and 14, each number of which is three.

Furthermore, on an upper surface of the lower surface plate 11 of the lower box 10, clamp fittings 30 and 40 are provided. In the case of individually mounting the respective shield connectors 100, the clamp fittings 30 and 40 can restrain the respective shield connectors 100 in axial, axial rotation, left-and-right and up-and-down directions thereof. Moreover, onto a lower surface of the upper surface plate 21 of the upper box 20, and onto the upper surface of the lower surface plate 11 of the lower box 10, press fittings 50 and 60 are fixed. In the case where the upper and lower boxes 20 and 10 are matched with each other, the press fittings 50 and 60 sandwich the shield terminal portions 130 of both ends of the shield connectors 100 from upper and lower sides, and conduct the shield terminal portions 130 to the upper and lower boxes 20 and 10. These clamp fittings 30 and 40 and the press fittings 50 and 60 are arrayed so as to array and arrange the three shield connectors 100 in substantially parallel to one another in the left-and-right direction.

Figure 9:
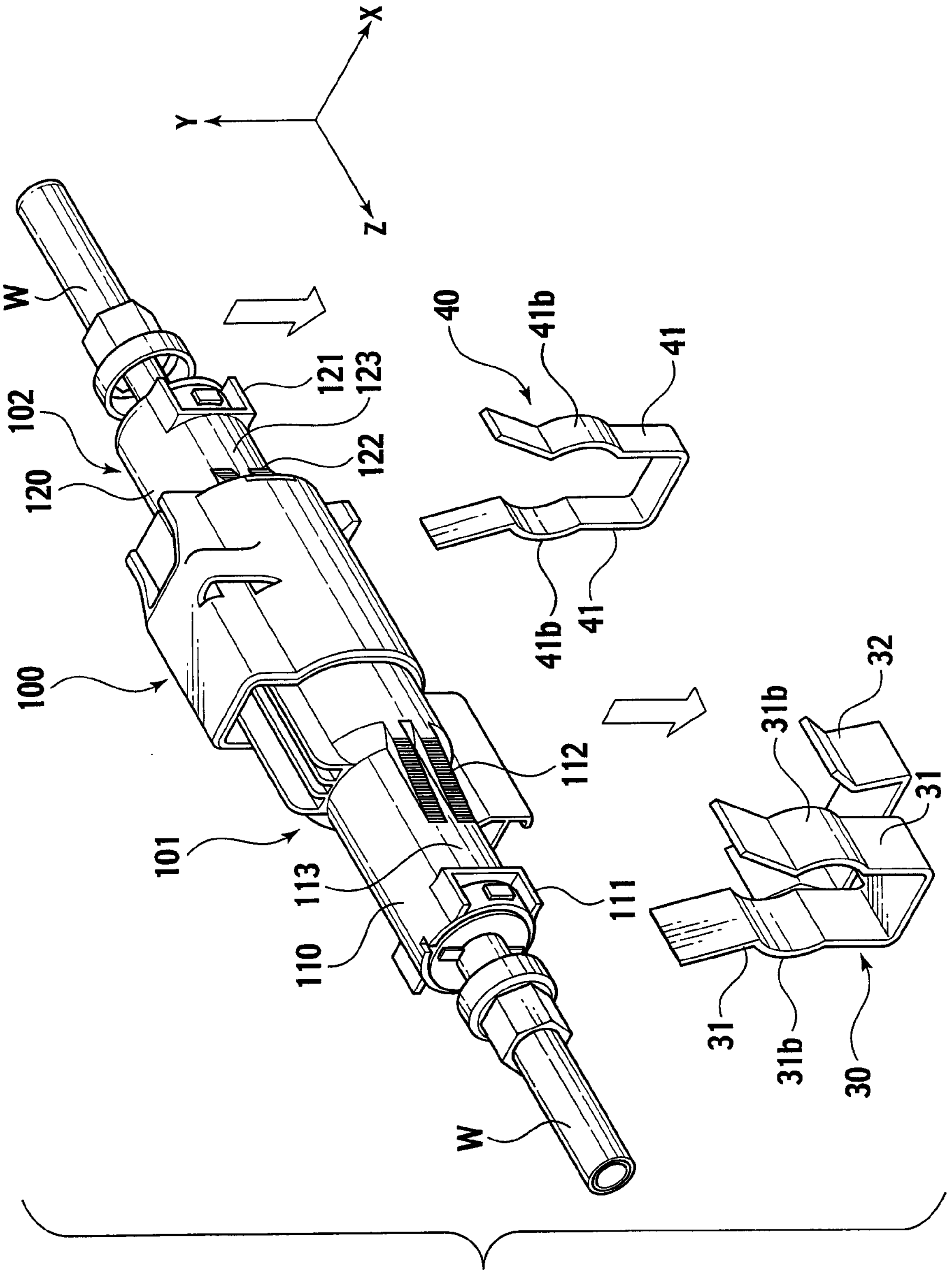
FIG. 9 is a perspective view showing a state before the shield connector is clamped by the clamp fittings.
Figure 10:
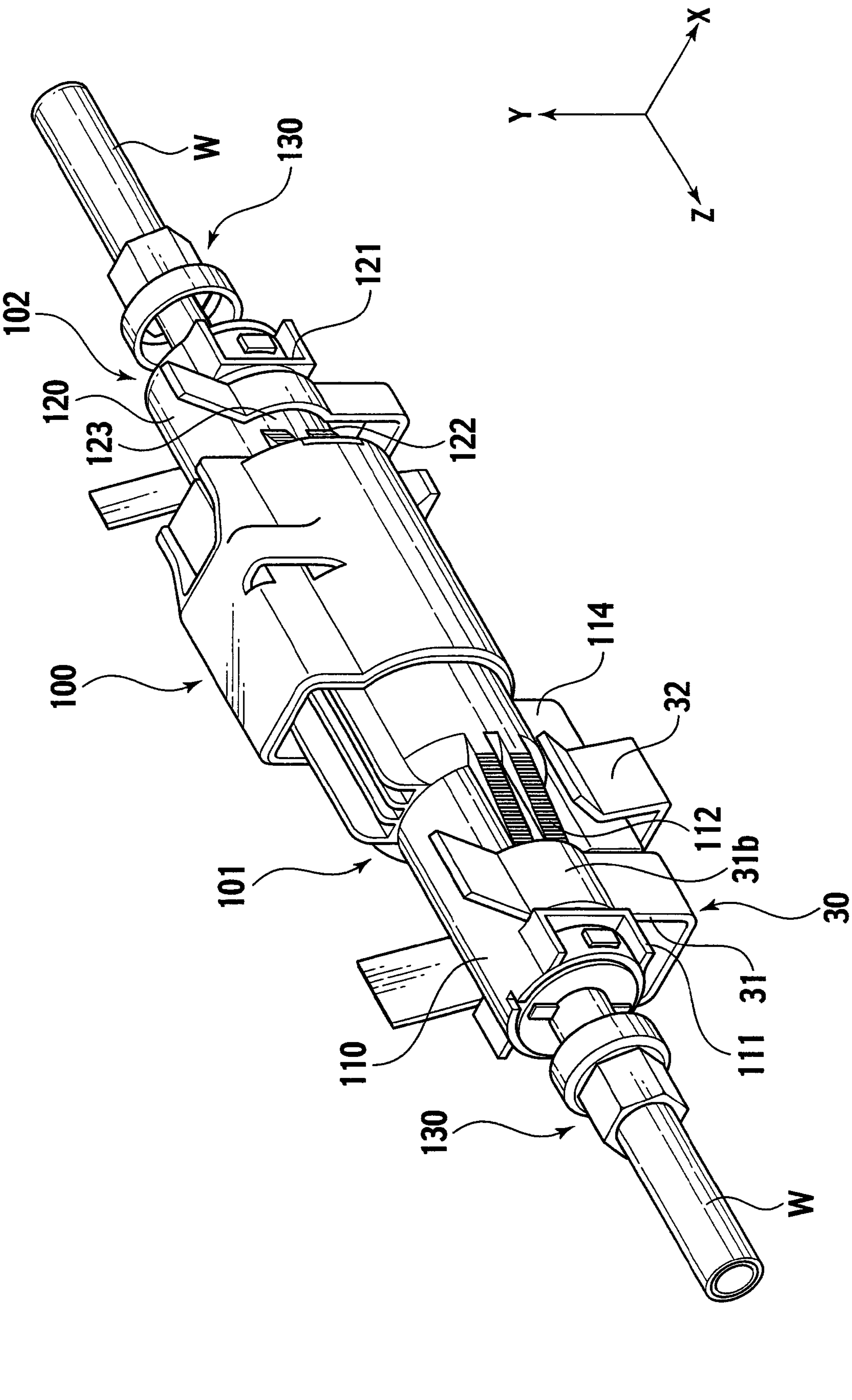
FIG. 10 is a perspective view showing a state after the shield connector is clamped by the clamp fittings.
Figure 11:
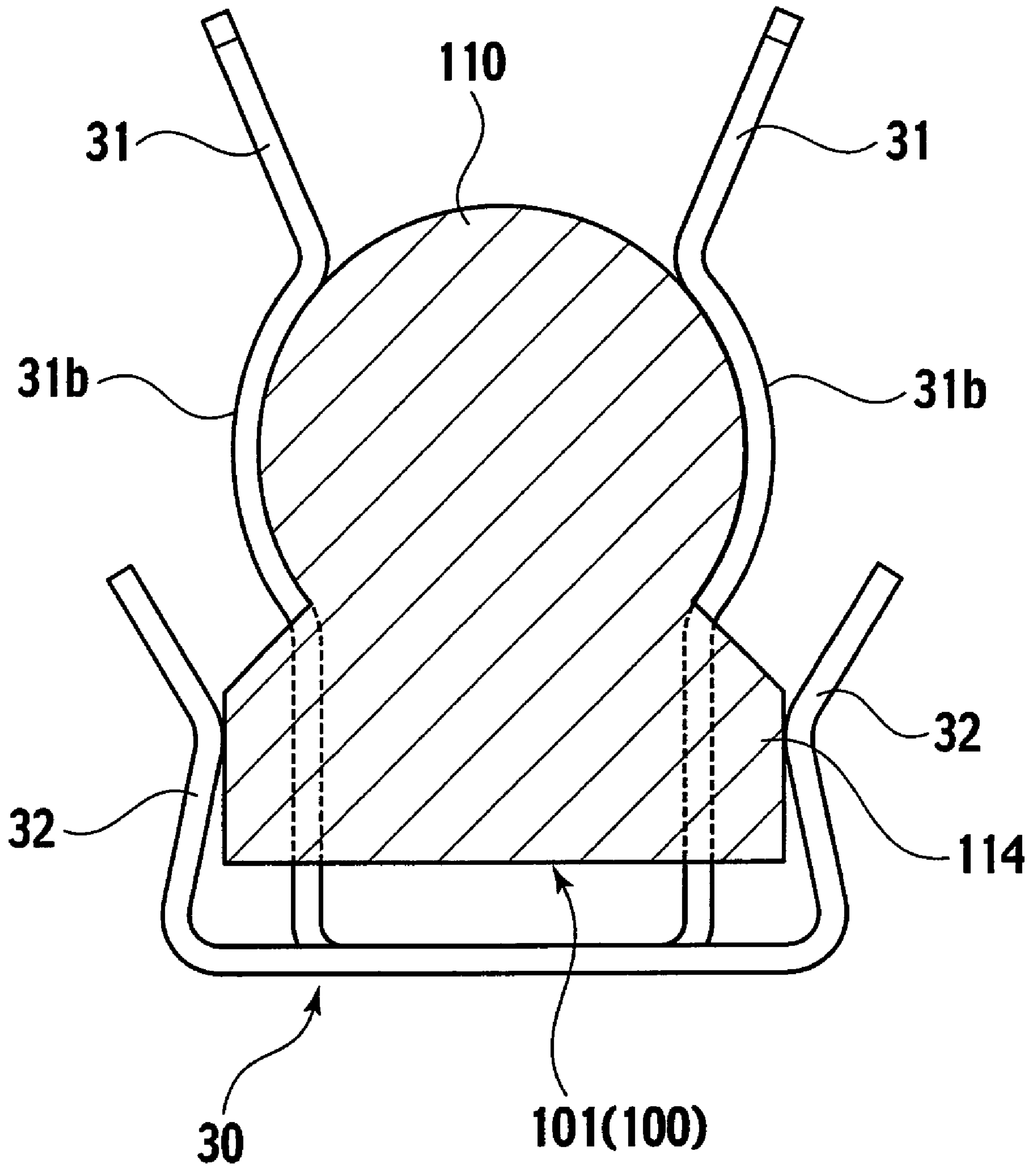
FIG. 11 is a cross-sectional view of a state where the shield connector is clamped by the front-side clamp fitting.

As shown in FIG. 9 and FIG. 10, clamp mechanisms for fixing the shield connectors 100 are composed of three sets, each of which has first to third sandwiching pieces 31, 32 and 41. The first to third sandwiching pieces 31, 32 and 41 are provided so as to correspond to three (first to third) sandwiched portions 113, 114 and 123 arranged in a longitudinal direction of the shield connector 100. The first to third sandwiching pieces 31, 32 and 41 sandwich the respective sandwiched portions 113, 114 and 123 from left and right sides when the respective sandwiched portions 113, 114 and 123 are inserted thereinto from the above, and thereby hold the shield connector 100 while restraining the shield connector 100 concerned in the left-and-right direction.

Figure 5A:
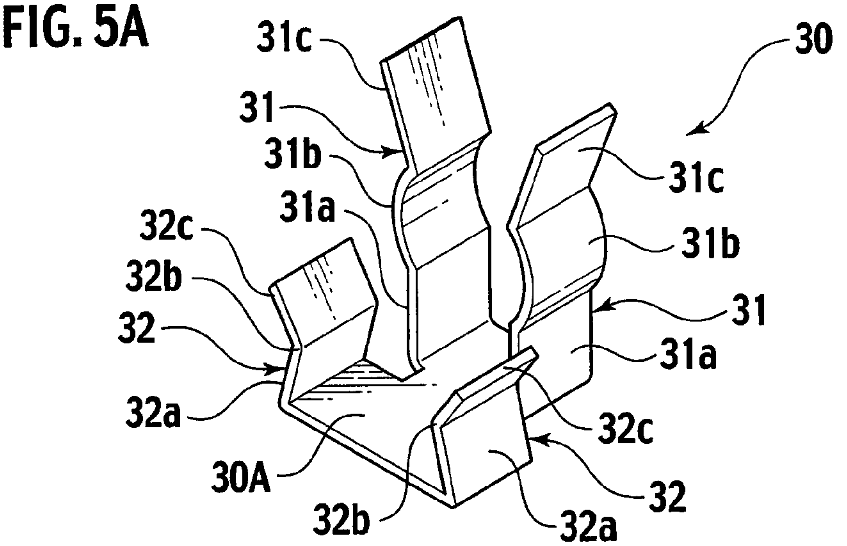
FIG. 5A is a perspective view showing a clamp fitting fixed to the lower box.
Figure 5B:
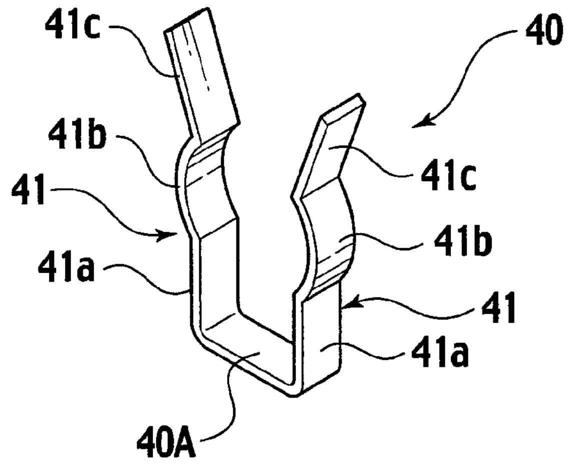
FIG. 5B is a perspective view showing another clamp fitting.

As shown in FIG. 5A, the first and second sandwiching pieces 31 and 32 are formed on a common board 30A of the first clamp fitting 30. Moreover, as shown in FIG. 5B, the second sandwiching piece 41 is formed on a board 40A of the second clamp fitting 40. These first to third sandwiching pieces 31, 32 and 41 are fixed to the lower box 10 in such a manner that, for example, the clamp fittings 30 and 40 are spot-welded to the lower surface plate 11 of the lower box 10.

The first sandwiching piece 31 includes: parallel plate portions 31*a*; curved portions 31*b* formed continuously on the parallel plate portions 31*a*; and plate portions 31*c* formed on the curved portions 31*b*. The parallel plate portions 31*a* are formed so as to be erected vertically upward from the common board 30A. The curved portions 31*b* are formed into a circular arc shape so as to correspond to a cylindrical shape of the first sandwiched portion 113. The plate portions 31*c* are formed into an expanded shape so as to facilitate the insertion of the first sandwiched portion 113.

As shown in FIGS. 9 and 10, the first sandwiching piece 31 has a width enough to allow engagement thereof with the first sandwiched portion 113 of which width is defined by protrusions 111 and 112 provided fore and aft of the first sandwiched portion 113 concerned. The first sandwiching piece 31 regulates movement of the shield connector 110 in the axial direction (Z-axial direction).

Moreover, the second sandwiching piece 32 of the first clamp fitting 30 shown in FIG. 5A includes: plate portions 32*a* formed upward from the common board 30A; and plate portions 32*c* formed on the plate portions 31*a* while interposing dogleg-shaped bent portions 32*b* therebetween. The plate portions 32*a* are formed upward from the common board 30A so as to be erected obliquely inward. Meanwhile, the plate portions 32*c* are formed into an expanded shape in order to facilitate the insertion of the second sandwiched portion 114. As shown in FIGS. 9 and 10, the second sandwiched portion 114 is formed into a rectangular shape in cross section, and the second sandwiching piece 32 sandwiches the second sandwiched portion 114 from the left and right sides, and thereby regulates rotation of the shield connector 100 about an axis (Z-axis) thereof.

Moreover, the third sandwiching piece 41 includes: parallel plate portions 41*a* erected vertically upward from the board 40A; curved portions 41*b* formed continuously on the parallel plate portions 41*a*; and plate portions 41*c* formed on the curved portions 41*b*. The curved portions 41*b* are formed into a circular arc shape so as to correspond to a cylindrical shape of the third sandwiched portion 123. The plate portions 41*c* are formed into an expanded shape so as to facilitate the insertion of the third sandwiched portion 123. Note that the third sandwiching piece 41*c* sandwiches the third sandwiched portion 123 from the left and right sides while ensuring a play in the axial direction.

In the case where the respective first to third sandwiched portions 113, 114 and 123 are individually inserted into these first to third sandwiching pieces 31, 32 and 41, the first sandwiching piece 31 and the third sandwiching piece 41 can regulate the movement of the shield connector 100 in the axial direction (Z-axial direction), the left-and-right direction (X-direction) and the up-and-down direction (Y-direction). Moreover, the second sandwiching piece 32 can regulate the movement of the shield connector 100 about the axis (Z-axis).

Figure 5C:
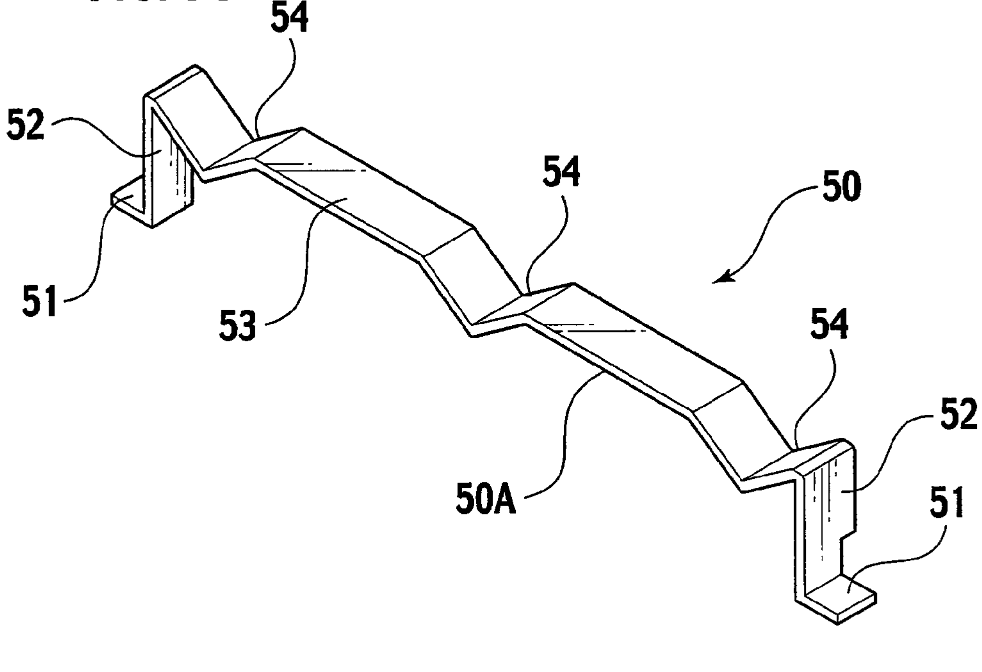
FIG. 5C is a perspective view showing a press fitting.
Figure 6A:
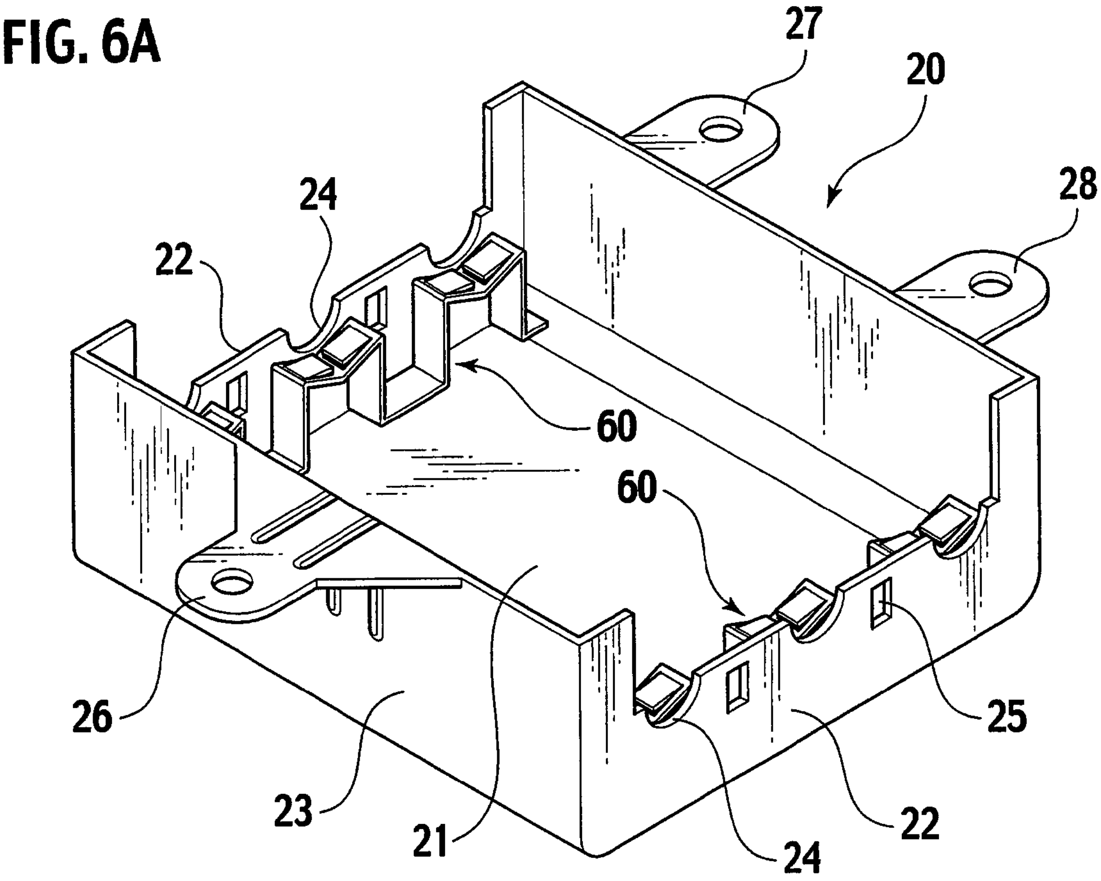
FIG. 6A is a perspective view showing a configuration of an upper box of the shield box.
Figure 6B:
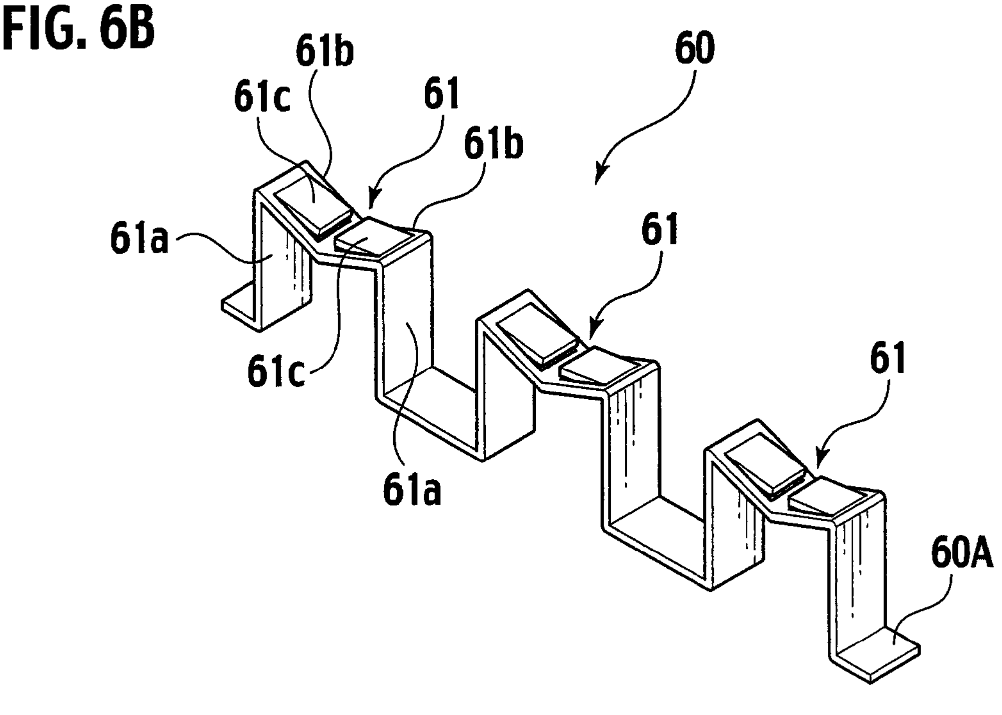
FIG. 6B is a perspective view showing a configuration of a press fitting fixed to the upper box.
Figure 7A:
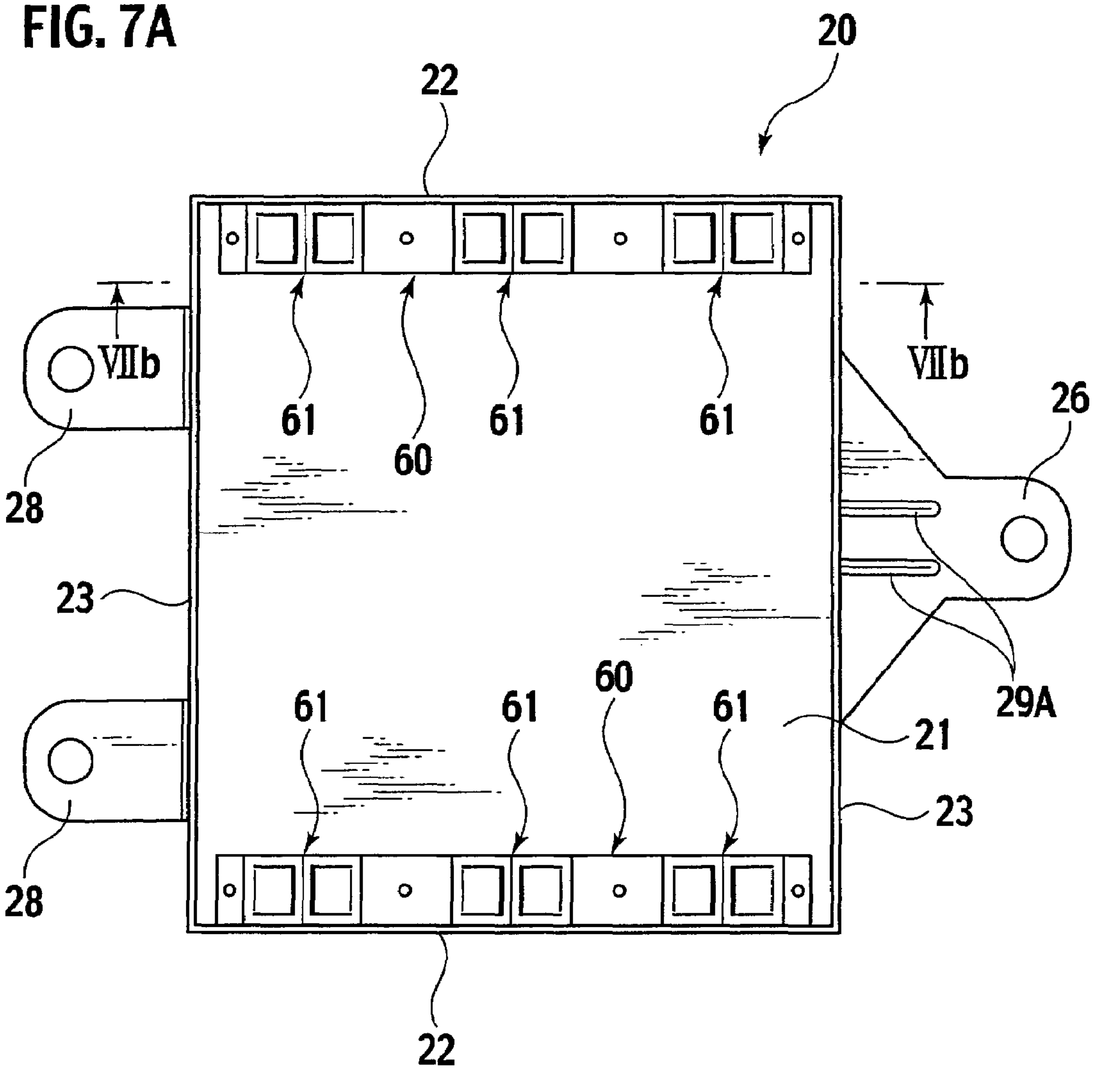
FIG. 7A is a plan view showing the configuration of the upper box.
Figure 7B:
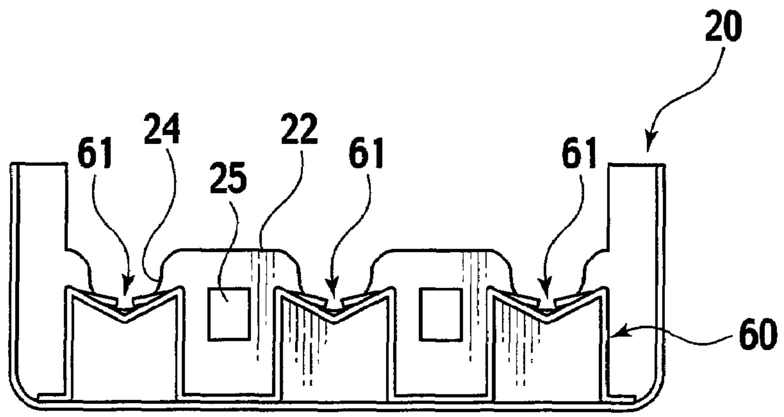
FIG. 7B is an arrow cross-sectional view taken along a line VIIb-VIIb of FIG. 7A.

Moreover, as shown in FIGS. 5C and 6B, the press fittings 50 and 60 provided in the upper box 20 and the lower box 10 are formed by performing bending processes for band plates 50A and 60A. The press fittings 50 and 60 have V-type groove portions 54 and 61 formed by bending the band plates 50A and 60A to a V shape, respectively.

As shown in FIG. 5C, each of the press fittings 50 on the lower box 10 side is composed of: leg portions 51 on left and right ends, which are to be welded; pillar portions 52 on the left and right ends, which are erected from the leg portions 51; and lateral plate portions 53 bridged across the pillar portions 52 on the left and right ends. Moreover, on the lateral plate portions 53, three V-type groove portions 54 are formed.

As shown in FIG. 6B, each of the press fittings 60 on the upper box 20 side has three M-shaped portions formed by performing a bending process for the band plate 60A. Each of the M-shaped portions has a pair of pillar portions 61*a*, and a V-type groove portion 62 formed into a V shape on upper ends thereof. The V-type groove portion 61 has a V-type wall 61*b*. On the V-type wall 61*b*, there are provided spring pieces 61*c* which urge the shield terminal portion 130 toward the V-type groove portion 54. The spring piece 61*c* is formed, for example, by incising the V-type wall 61*b* and raising a portion surrounded by an incision thus made.

By the above-described bending processes, these V-type groove portions 54 and 61 are provided in an elastically supported state at positions floated from the upper surface plate 21 of the upper box 20 and the lower surface plate 11 of the lower box 10, and the shield terminal portions 130 are sandwiched by the V-type groove portions 54 and 61 of the press fittings 50 and 60 of the upper and lower boxes 20 and 10. Here, the V-type groove portions 54 and 61 make pairs.

Next, a description will be made of functions.

First, three pairs of the shield wires W are individually interconnected by the three shield connectors 100. Then, as shown in FIG. 12, each of the shield conductors (braids) Ws of the shield wires W is crimped by a shield terminal 132 and a shield sleeve 131 in a state where the shield conductor Ws is sandwiched thereby. In such a way, the shield terminal portion 130 is composed. Next, these three shield connectors 100 are mounted onto the lower box 10 from the above, and the first to third sandwiched portions 113, 114 and 123 of each of the shield connectors 100 are inserted into the first to third sandwiching pieces 31, 32 and 41, respectively. Then, the first and third sandwiched portions 113 and 123 are sandwiched between the curved portions 31*b* of the first sandwiched portion 113 and between the curved portions 41*b* of the third sandwiched portion 123, whereby each of the shield connectors 100 is held and fixed.

Figure 15:
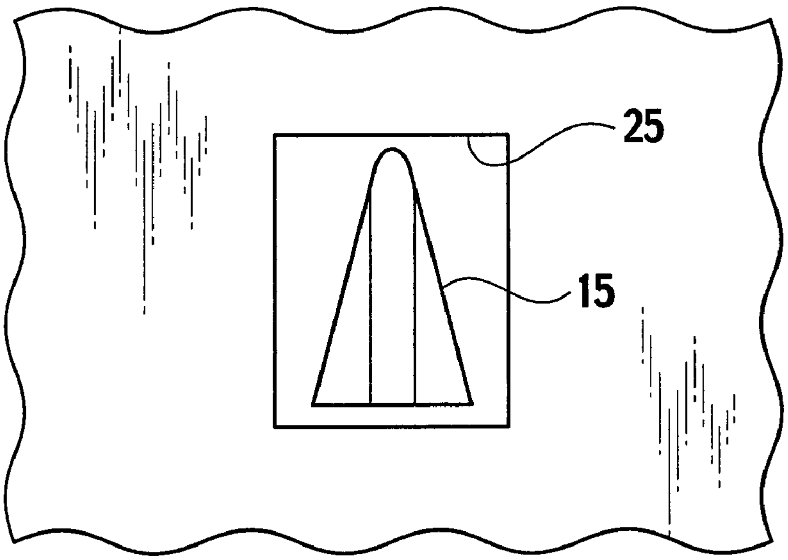
FIG. 15 is a view showing a relationship between an engagement hole and an engagement protrusion when the shield connector is housed in the shield box of this embodiment.
Figure 16:
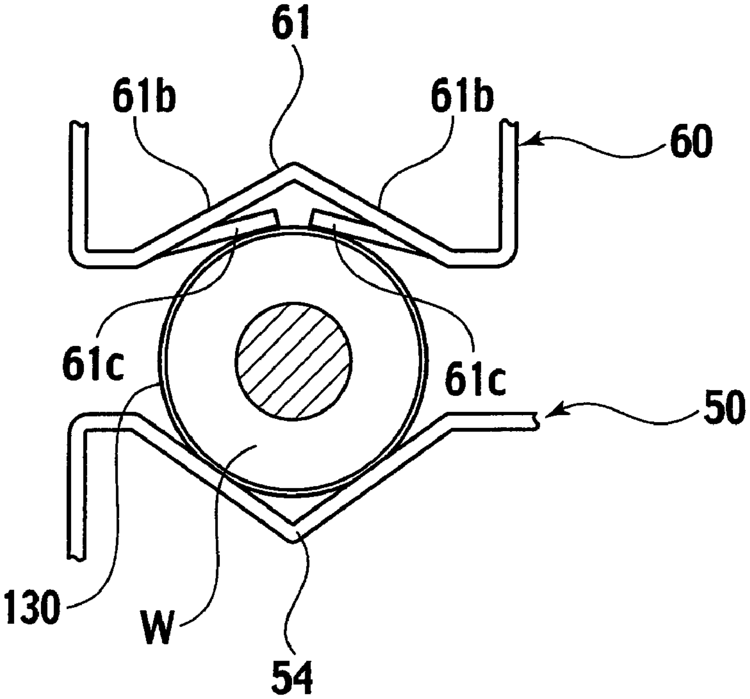
FIG. 16 is a cross-sectional view showing a relationship between the press fitting and the shield terminal portion when the shield connector is housed in the shield box of this embodiment.

Next, the upper box 20 is allowed to cover the shield connectors 100 and the lower box 10 from the above, and the attachment brackets 26, 27 and 28 of the upper box 20 are allowed to overlap the attachment brackets 16, 17 and 18 of the lower box 10. Then, as shown in FIG. 15, the engagement holes 25 and the engagement protrusions 15 fit to each other, whereby the upper and lower boxes 20 and 10 are engaged with each other. In this state, as shown in FIG. 14, the attachment brackets 26, 27, 28, 16, 17 and 18 are fastened to the body 220 by the bolts 200.

Then, the press fittings 50 and 60 of the upper and lower boxes 20 and 10 are brought into press contact with the shield terminal portions 130, and the shield terminal portions 130 are grounded to the body 220 through the press fittings 50 and 60 and the upper and lower boxes 20 and 10.

In this case, since the clamp mechanisms (first to third sandwiching pieces 31, 32 and 41) which restrain the respective shield connectors 100 in the axial, axial rotation, left-and-right and up-and-down directions are provided on the upper surface of the lower surface plate 11 of the lower box 10, the respective shield connectors 100 are surely fixed. In addition, the upper and lower boxes 20 and 10 are matched with each other in the above-described state, whereby the shield terminal portions 130 of both ends of the shield connectors 100 are sandwiched by the press fittings 50 and 60 from the upper and lower sides, and accordingly, the contact between the press fittings 50 and 60 and the shield terminal portions 130 can be stabilized, and shielding reliability can be enhanced.

Moreover, since the shield terminal portions 130 are sandwiched by the V-type groove portions 54 and V-type groove portions 61 of the upper and lower press fittings 50 and 60, the contact between the shield terminal portions 130 and the press fittings can be stabilized. Furthermore, the V-type groove portions 54 and 61 are formed by performing the bending processes for the band plates 50A and 60A, and in addition, are elastically supported at the positions floated from the upper surface plate 21 of the upper box 20 and the lower surface plate 11 of the lower box 10. Accordingly, the press fittings 50 and 60 can be brought into elastic contact with the shield terminal portions 130, and more resistance to vibrations and the like is also brought up.

Furthermore, in the case of the shield box of this embodiment, the spring pieces 61*c* are further provided on the V-type walls 61*b* constituting the V-type groove portions 61 of the upper box 20. Accordingly, the press fittings 60 can be brought into contact with the shield terminal portions 130 more gently, and the contact and conduction therebetween can be further stabilized.

Moreover, in the case of the shield box of this embodiment, the engagement holes 25 and the engagement protrusions 15 are provided in the left-and-right center regions of the end surface plates 22 and 12 of the upper and lower boxes 20 and 10. Accordingly, even when the upper and lower boxes 20 and 10 are fixed by the attachment brackets 16, 17, 18, 26, 27 and 28 provided on the left and right ends thereof, the center portion of the upper box 20 can be prevented from floating up, and the press fittings 50 and 60 can be brought into contact with any of the shield terminal portions 130 of the shield connectors 100 in a good state, and the shielding performance can be stabilized.

Furthermore, the beads 29A and 29B are provided on the plate surfaces of the bent portion of the attachment bracket 26 of the upper box 20. Accordingly, flexural rigidity of the attachment bracket 26 concerned can be enhanced, and the shielding performance in a state where the shield connectors are fixed can be stabilized.

What is claimed is:

1. A shield box that houses therein a plurality of shield connectors interconnecting shield wires, and electromagnetically shields entirety of the shield connectors and the shield wires, comprising:

a metal-made upper box;

a metal-made lower box combined with the metal-made upper box;

clamp mechanisms provided on an upper surface of a lower surface plate of the lower box; and press fittings provided on opposite surfaces of the upper box and the lower box, wherein, in a case of individually mounting the respective shield connectors, the clamp mechanisms restrain the respective shield connectors in axial, axial rotation, left-and-right and up-and-down directions thereof, and when the upper box and the lower box are combined with each other, the press fittings sandwich shield terminal portions of both ends of the shield connectors from upper and lower sides, and bring the shield terminal portions into electric contact with the upper box and the lower box.

2. The shield box according to claim 1, wherein each of the clamp mechanisms includes first to third sandwiching pieces provided to correspond to first to third sandwiched portions arranged in a longitudinal direction of the shield connector, and the first to third sandwiching pieces sandwich the respective sandwiched portions from left and right sides when the respective sandwiched portions are inserted thereinto from the above, and thereby hold the shield connector while restraining the shield connector in the left-and-right direction, the first sandwiching piece includes curved portions with a circular arc shape corresponding to a cylindrical shape of the first sandwiched portion, has a width enough to allow engagement thereof with the first sandwiched portion of which width is defined by protrusions provided fore and aft of the first sandwiched portion, and thereby regulates movement of the shield connector in the axial direction, the second sandwiching piece sandwiches the second sandwiched portion formed into a rectangular shape in cross section from the left and right sides, and thereby regulates rotation of the shield connector about an axis thereof, the third sandwiching piece has curved portions with a circular arc shape corresponding to a cylindrical shape of the third sandwiched portion, and sandwiches the third sandwiched portion from the left and right sides while ensuring a play in the axial direction, and in a case where the respective first to third sandwiched portions are individually inserted into the first to third sandwiching pieces, the first sandwiching piece and the third sandwiching piece regulate the movement of the shield connector in the axial direction, the left-and-right direction and the up-and-down direction, and the second sandwiching piece regulates the movement of the shield connector about the axis.

3. The shield box according to claim 1, wherein each of the press fittings is a band plate having V-type groove portions formed by bending the band plate to a V shape, the V-type groove portions are provided in an elastically supported state at positions floated from the upper surface plate of the upper box and the lower surface plate of the lower box, and the shield terminal portions are sandwiched by the V-type groove portions of one of the press fittings and by the V-type groove portions of the other press fitting, each V-type groove portion making a pair with the V-type groove portion of the one of the press fittings.

4. The shield box according to claim 3, wherein, on a V-type wall that forms at least one of the V-type groove portions which make each pair, cut and raised spring pieces which urge the shield terminal portion toward the other V-type groove portion are provided.

5. The shield box according to claim 1, further comprising:

outlets for the shield wires, which are provided in regions where fore-and-aft end surface plates of the upper box and the lower box are allowed to overlap each other;

engagement holes and engagement protrusions, which are provided in at least left-and-right center regions of the fore-and-aft end surface plates, are engaged with each other, and thereby combine the upper box and the lower box with each other; and attachment brackets which are provided on left-and-right side edges of the upper box and the lower box, are protruded outward therefrom, and vertically overlap each other when the upper box and the lower box are matched with each other, wherein the clamp mechanisms are arrayed in the left-and-right direction to be capable of arraying the plurality of shield connectors in parallel to one another.

6. The shield box according to claim 5, wherein at least one of the attachment brackets of the upper box includes a reinforcing bead extended in a bending direction of the attachment bracket on a surface of a region including a bent portion for forming the attachment bracket, and is formed in such a manner that a protruding piece extended integrally on a lower end of a side plate of the upper box is bent outward perpendicularly.

* * * * *